| United States Patent [19] | [11] Patent Number: 4,874,646 |
|---|---|
| Tsujino et al. | [45] Date of Patent: Oct. 17, 1989 |

[54] ULTRAFINE TUBE AND METHOD FOR ITS PRODUCTION

[75] Inventors: Yoshikazu Tsujino, Sakai; Yuuji Hamada; Masakazu Sakata, both of Hirakata; Takanori Fujii, Hirakata; Yukinori Kuwano, Katano, all of Japan

[73] Assignee: Sanyo Electric Co., Ltd., Moriguchi, Japan

[21] Appl. No.: 196,170

[22] Filed: May 17, 1988

[30] Foreign Application Priority Data

May 18, 1987 [JP] Japan .................... 62-120803

[51] Int. Cl.$^4$ ............................................. B27N 5/02
[52] U.S. Cl. .................................. 428/34.1; 428/913; 428/34.7; 430/311; 430/313; 430/315; 430/330; 430/394; 430/945
[58] Field of Search ............... 428/36, 913, 34.1, 34.7; 430/311, 315, 313, 330, 945, 394

[56] References Cited

U.S. PATENT DOCUMENTS

| 4,408,213 | 10/1983 | Bell | 430/945 |
| 4,527,173 | 7/1985 | Gupta et al. | 430/945 |
| 4,539,572 | 9/1985 | Robbins et al. | 430/945 |

OTHER PUBLICATIONS

Double Exposure Stabilization of Positive Photoresist, Journal App. Polymer Science, vol. 30, 547–555 (1985) Yanazawa et al.

*Primary Examiner*—Ellis P. Robinson
*Assistant Examiner*—P. J. Ryan
*Attorney, Agent, or Firm*—Armstrong, Nikaido, Marmelstein, Kubovcik & Murray

[57] ABSTRACT

An ultrafine tube is produced by a method comprising the steps of applying a highly polymerized material on a substrate to form a resist layer on a surface of said substrate, applying a laser beam to the resist layer under such a condition that said resist layer is melted to form an ultrafine tube between the substrate and resist layer in the predetermined pattern.

7 Claims, 2 Drawing Sheets

(a)

(b)

(c)

ULTRAFINE TUBE AND METHOD FOR ITS PRODUCTION

BACKGROUND OF THE INVENTION

This invention relates to an ultrafine tube and a method for its production and, more particularly, it relates to a method for producing ultrafine tubes for use as cooling channels in semiconducting integrated circuit elements, columns in microsized analyzer, light-piping channels in photo circuit elements and the like.

Recently, there has been proposed a method for producing ultrafine tubes in Japanese patent laid-open No. 59-56729, which includes the steps diagrammed in FIG. 6. In this method, a substrate (1) is firstly coated with a photosensitive emulsion to form a first positive resist layer (8) which is then coated with a lower photosensitive emulsion to form a second positive resist layer (9) with a photosensitivity lower than that of the first resist layer (8), as shown in FIG. 6a. The first and second resist layers (8) (9) are exposed to light everywhere except in the area beneath the two parallel lines, and then developed, so that the unexposed resist layers are rinsed off, leaving the resist layers in the condition shown in part (b) of FIG. 6. Since the high sensitive emulsion (8) is eroded greatly as compared with the low sensitive emulsion (9), each island (3) of the resist layer will have a thin leg portion (4) and head portion (5). During development, the islands becomes soft and easy to deform, the islands bend in the direction so that their head portions (5) come close to one another and the islands (3) are joined together at their head portions to form an ultrafine tube (6).

However, this method involves complicated steps such as exposure and development. In addition, it is difficult with this method to produce ultrafine tubes with a complicated shape.

SUMMARY OF THE INVENTION

It is therefore a main object of the present invention is to provide a method for producing ultrafine tubes, which is easy to operate.

Another object of the present invention is to provide a method for producing ultrafine tubes, which makes it possible to produce ultrafine tubes having fairly complicated shapes at low cost.

According to the present invention, there is provided a method for producing ultrafine tubes, comprising the steps of applying a highly polymerized material on a substrate to form a resist layer on a surface of said substrate, applying a laser beam to the resist layer under such a condition that said resist layer is melted to form an ultrafine tube between the substrate and resist layer in the predetermined pattern.

As a highly polymerized material, there may be used any of the conventionally known positive type photoconductive materials such as, for example, polymethyl methacrylate, polymethyl isopropenyl ketone, polytrichloroethyl methacrylate, poly-α-cyanoacrylate, polyhexafluorobutyl methacrylate, poly-α-methylstyrene, polytrifluoro-α-chloroacrylate, poly-l-butene, and other polymethacrylate or polyacrylate esters and derivatives thereof.

As a material for substrates, there may be used those such as metals, ceramics, and any of the conventionally known materials which is not decomposed by the laser beam applied thereto. The choice of the material depends on the type of application.

According to the present invention, the ultrafine tubes can be produced with ease only by applying the laser beam to the resist layer in the predetermined pattern, thus making it possible to simplify the production of ultrafine tubes.

The method of the present invention is applicable to various purposes. For example, it is possible with method of the present invention to produce semiconductor integrated circuit elements, separation columns for use in analytical instruments such as gas chromatographs and liquid chromatographs, light-piping lines in photo switching elements.

The above and other objects, features and advantages of the present invention will be further apparent from the detailed description given hereinafter. It should be understood, however, that detailed description and specific examples, while indicating preferred embodiment of the invention, are given by way of illustration only, since various changes and modifications within the spirit and scope of the invention will become apparent to those skilled in the art from this description.

DETAILED DESCRIPTION OF THE PREFERRED EMBODIMENT

Figure 1:
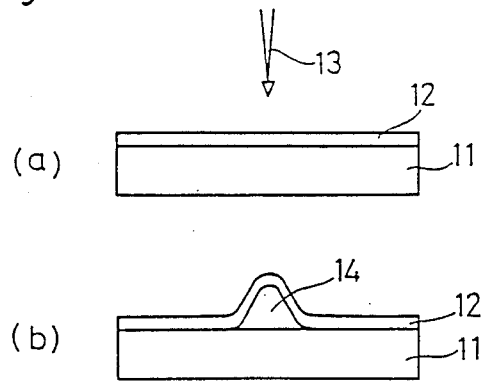
FIG. 1 is a diagram illustrating the steps in producing ultrafine tubes in accordance with the present invention.

As illustrated in part (a) of FIG. 1, there was first formed a resist layer (12) of a thickness of 2 μm on a substrate (11) of silicon by applying a polymethyl methacrylate emulsion to a surface of the substrate. The resultant resist layer (12) was applied with a laser beam from a YAG laser with ratings of an output power of 3.0 W and a wave length of 1.06 μm in a predetermined pattern to form an ultrafine tube (14) between the substrate (11) and resist layer (12). During this step, the substrate was kept separate from the focal point of the YAG laser by a distance of 4 mm, and the laser was moved along the pattern at a relative rate of 80 mm/sec in a plane parallel to the surface of the substrate.

The resist layer (12) is partially melted by the application of the laser beam and, at the same time, it is partially decomposed with evolution of gases. A part of the produced gas stays between the melted resist layer (12) and substrate (11) and lifts up the melted resist layer (12), so that an ultrafine space or tube (14) is produced between the substrate (11) and resist layer (12), as shown in part (b) of FIG. 1.

Figure 2:
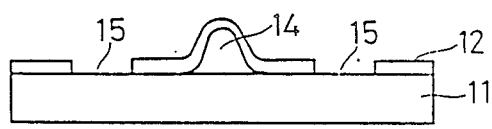
FIG. 2 is a section of a modified ultrafine tube produced in accordance with the present invention.

Referring now to FIG. 2, there is shown a modified form of the ultrafine tube (14) which is separated from the main part of the resist layer (12). This is achieved by partially removing the resist layer (12) to form recesses (15) on both sides of the ultrafine tube (14). In this embodiment, a laser beam was applied to the resist layer (12) present on both sides of the ultrafine tube (14) to remove the resist layer (12) partially by decomposition, thereby forming recesses (15) on both sides of the ultrafine tube (14). The substrate was kept separate from the focal point of a YAG laser (Output: 3.5 W, wave length: 1.06 μm) by a distance of 6 mm, and the laser was moved at a relative rate of 20 mm/sec in a plane parallel to the surface of the substrate (11) along the predetermined pattern.

Figure 3:
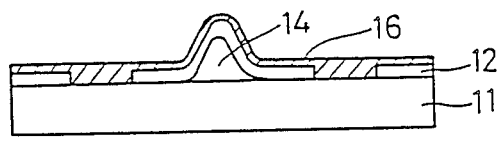
FIG. 3 is a section of another form of an ultrafine tube produced in accordance with the present invention.

If the occasion demands, the ultrafine tube (14) shown in FIG. 1 or FIG. 2 may be reinforced by a metal layer (16) as shown in FIG. 3. This metal layer (16) can be formed by the conventionally known thin film techniques such as vapor deposition, sputtering and the like.

Figure 4:
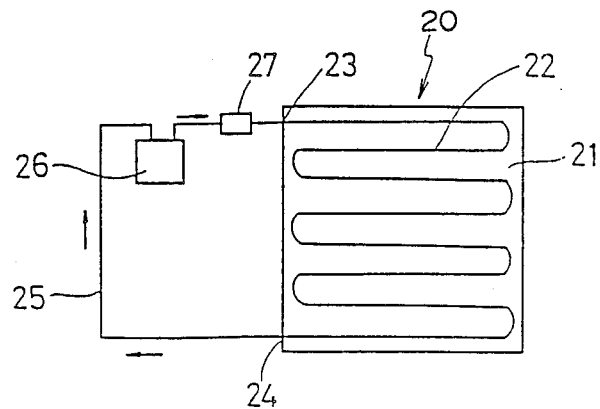
FIG. 4 is a diagram showing an ultrafine tube applied to a cooling system for semiconductor integrated circuits.
Figure 5:
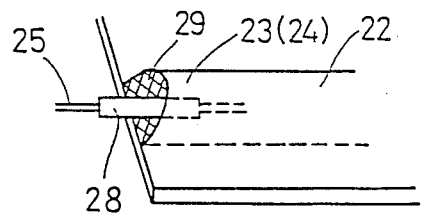
FIG. 5 is an enlarged perspective view of the ultrafine tube used in FIG. 4.
Figure 6:
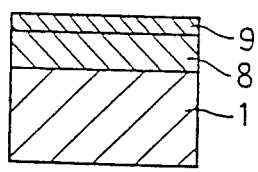
FIG. 6 is a diagram illustrating the steps in producing ultrafine tubes according to the prior art.
Figure 6:
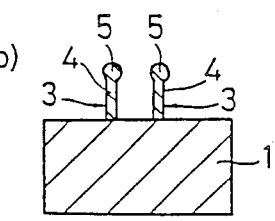
Figure 6:
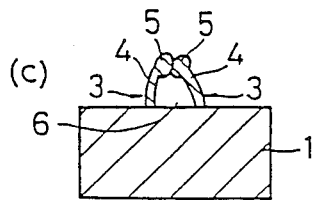

Referring now to FIGS. 4 and 5, there is shown an ultrafine tube (22) applied to a semiconductor device (20) comprising a substrate (21) on one side of which one or more integrated circuits are mounted. The substrate (21) is provided on its other side with a meandering ultrafine tube (22) to form a passageway for a cooling medium such as water. The ultrafine tube (22) is connected at its inlet and outlet (23), respectively to a pump (26) and a filter (27) through a pipe (25) of a flexible material such as synthetic resin to form a circulating line for the cooling medium. As shown in FIG. 5, each end of the pipe (25) is reinforced by a metal pipe (28) and then inserted into the inlet (23) or outlet (24) of the ultrafine tube (22). A connecting part between the pipe and the ultrafine tube is sealed by a sealing material such as, for example, a synthetic resin. The synthetic resin used as a sealing material includes, without being limited to, acryl resins and epoxy resins.

In use, a cooling medium such as water is fed by the pump (26) through the pipe (25) and filter (27) into the substrate (21), where the heat generated in the integrated circuits is absorbed and carried away by water passing through the ultrafine tube (22). The water is then led into the pipe (25), where the heat absorbed by water is naturally radiated to the surrounding air through the pipe (25). The water is then led to the pump (26), and the cycle begins anew. Thus, such a cooling system makes it possible to prevent the semiconductor devices mounted on the substrate (21) from rising in temperature.

In order to facilitate the natural heat radiation, the pipe (25) may have cooling fins integrally formed thereon.

The method of the present invention may be applied to production of light-piping lines in opto isolators. In this case, an ultrafine tube is first formed on the substrate in accordance with the method of the present invention, and then filled with a polymer of a high refractive index to form a fine light-piping line. If polymethyl methacrylate is used as the polymer to be filled into the ultrafine tube, it is preferred to cover the ultrafine tube with a metal.

Also, the present invention can be applied to production of separation columns for use in gas chromatographs or liquid chromatographs. In this case, the separation columns of ultrafine tubes are produced by forming a resist layer on a substrate, applying a laser beam to the resist layer in a predetermined pattern to form one or more ultrafine tubes. The resist layer is then applied with a laser beam to remove the unwanted portion of the resist layer from the substrate except in those areas surrounding the ultrafine tubes, and the produced fine tubes are covered with a metal layer formed on the surfaces of the resist layer and substrate. The resist layer forming the ultrafine tubes is then rinsed off with an organic solvent such as acetone, leaving the metal layer on the substrate. The ultrafine tubes are now formed by the metal layer and the substrate. The interior wall of the ultrafine tube is then wet with a gas absorber. The use of ultrafine tube makes it possible to miniaturize the devices.

What is claimed is:

1. A method for producing ultrafine tubes, comprising the steps of applying a highly polymerized material of a positive type photoconductive material on a substrate to form a positive acting resist layer on a surface of a said substrate, applying a laser beam to said photoresist layer under such a condition that said resist layer is partially melted and partially decomposed with production of gases to form an ultrafine tube between the substrate and resist layer in a predetermined pattern, said substrate being of a material having a melting point higher than the highly polymerized material and which not decomposed by said laser beam applied thereto.

2. A method for producing ultrafine tubes according to claim 1 further comprising the steps of forming a metal layer on the resist layer after forming the ultrafine tube between the resist layer and the substrate.

3. A method for producing ultrafine tubes according to claim 1 further comprising the steps of, after forming the ultrafine layer between the resist layer and substrate, removing an unwanted portion of the resist layer except in those areas surrounding the ultrafine tubes, forming a metal layer on the surface of the resist layer and the substrate, and rinsing off the remaining resist layer to form an ultrafine tube surrounded by the metal layer and the substrate.

4. A method for producing ultrafine tubes according to claim 1 wherein said highly polymerized material is selected from the group consisting of polymethyl methacrylate, polymethyl isopropenyl ketone, polytrichloroethyl methacrylate, poly-α-cyanoacrylate, polyhexafluorobutyl methacrylate, poly-α-methylstyrene, polytrifluoro-α-chloroacrylate, poly-l-butene, polymethacrylate esters and derivatives thereof, and polyacrylate esters and derivatives thereof.

5. A method for producing ultrafine tubes according to claim 1 wherein said substrate is selected from the group consisting of metals, ceramics and materials which are not decomposed by laser energy.

6. An ultrafine tube comprising a substrate of a material which is not decomposed by laser energy, and a positive acting photoresist layer formed on said substrate, said photoresist layer being partially lifted up from said substrate to form an ultrafine tube between said photoresist layer and substrate in a predetermined pattern.

7. The ultrafine tube according to claim 6 wherein said resist layer forming the ultrafine space is covered with a metal layer.

* * * * *

UNITED STATES PATENT AND TRADEMARK OFFICE
CERTIFICATE OF CORRECTION

PATENT NO. : 4,874,646
DATED : October 17, 1989
INVENTOR(S) : TSUJINO et al

It is certified that error appears in the above-identified patent and that said Letters Patent is hereby corrected as shown below:

Column 1, lines 58 and 59, "photoconductive" should read
--photosensitive--.

Column 4, line 17, "photoconductive" should read
--photosensitive--.

Signed and Sealed this

Fifth Day of February, 1991

*Attest:*

HARRY F. MANBECK, JR.

*Attesting Officer*    *Commissioner of Patents and Trademarks*